(12) United States Patent
Takizawa et al.

(10) Patent No.: US 8,666,551 B2
(45) Date of Patent: Mar. 4, 2014

(54) SEMICONDUCTOR-PROCESSING APPARATUS EQUIPPED WITH ROBOT DIAGNOSTIC MODULE

(75) Inventors: Masahiro Takizawa, Nagaoka (JP); Teruhide Nishino, Yokohama (JP)

(73) Assignee: ASM Japan K.K., Tokyo (JP)

( * ) Notice: Subject to any disclaimer, the term of this patent is extended or adjusted under 35 U.S.C. 154(b) by 1107 days.

(21) Appl. No.: 12/341,869

(22) Filed: Dec. 22, 2008

(65) Prior Publication Data

US 2010/0158644 A1 Jun. 24, 2010

(51) Int. Cl.
*H01L 21/673* (2006.01)
*H01L 21/67* (2006.01)
*B25J 13/08* (2006.01)

(52) U.S. Cl.
USPC .............................. 700/259; 700/262; 901/47

(58) Field of Classification Search
USPC ......... 700/245, 258, 259, 262, 213, 218, 228; 901/46, 47, 30, 41; 414/217.1, 935, 414/941, 936, 937, 217
See application file for complete search history.

(56) References Cited

U.S. PATENT DOCUMENTS

| | | | |
|---|---|---|---|
| 4,559,451 A | 12/1985 | Curl | |
| 5,483,138 A | 1/1996 | Shmookler et al. | |
| 5,768,125 A | 6/1998 | Zinger et al. | |
| 5,822,213 A | 10/1998 | Huynh | |
| 5,870,488 A * | 2/1999 | Rush et al. | 382/151 |
| 6,298,280 B1 * | 10/2001 | Bonora et al. | 700/218 |
| 6,327,517 B1 | 12/2001 | Sundar | |
| 6,360,132 B2 * | 3/2002 | Lin et al. | 700/97 |
| 6,485,248 B1 * | 11/2002 | Taylor, Jr. | 414/672 |
| 6,788,991 B2 | 9/2004 | De Haas et al. | |
| 6,856,863 B1 | 2/2005 | Sundar | |
| 6,900,877 B2 | 5/2005 | Raaijmakers | |
| 6,996,456 B2 | 2/2006 | Cordell et al. | |
| 7,008,802 B2 | 3/2006 | Lu | |
| 7,039,501 B2 | 5/2006 | Freeman et al. | |
| 7,100,954 B2 | 9/2006 | Klein et al. | |
| 7,299,104 B2 | 11/2007 | Tezuka et al. | |
| 7,319,920 B2 | 1/2008 | Donoso et al. | |
| 7,360,981 B2 | 4/2008 | Weaver | |
| 7,572,092 B2 | 8/2009 | Hofmeister et al. | |
| 7,607,879 B2 | 10/2009 | Hall et al. | |
| 7,627,395 B2 * | 12/2009 | Sadighi et al. | 700/245 |
| 7,857,569 B2 * | 12/2010 | Hiroki et al. | 414/217 |
| 7,880,155 B2 * | 2/2011 | Krupyshev et al. | 250/559.3 |
| 2001/0051837 A1 * | 12/2001 | Tateyama et al. | 700/112 |
| 2002/0038164 A1 * | 3/2002 | Osaka et al. | 700/213 |
| 2002/0098818 A1 | 7/2002 | Yokogawa et al. | |
| 2003/0000844 A1 * | 1/2003 | Carl et al. | 205/183 |
| 2003/0197563 A1 | 10/2003 | Nishizono | |
| 2003/0231950 A1 * | 12/2003 | Raaijmakers | 414/800 |
| 2004/0240971 A1 | 12/2004 | Tezuka et al. | |

(Continued)

*Primary Examiner* — Jason Holloway
(74) *Attorney, Agent, or Firm* — Knobbe Martens Olson & Bear LLP

(57) ABSTRACT

A semiconductor wafer manufacturing apparatus is equipped with a diagnostic module for diagnosing integrity of a transfer robot. The diagnostic module is attached to one side of a semiconductor wafer transfer chamber provided with the transfer robot, which side is also used for the purpose of maintenance, for example. One or more sensors are installed in the diagnostic module so that when the transfer robot is inserted into the diagnostic module, the position or shape of each end effector of the transfer robot is detected and compared against a pre-registered normal condition, thereby diagnosing the integrity of the end effector of the transfer robot, while performing wafer processing.

18 Claims, 11 Drawing Sheets

(56) References Cited

U.S. PATENT DOCUMENTS

| | | |
|---|---|---|
| 2005/0100435 A1 | 5/2005 | Dickinson |
| 2005/0102064 A1* | 5/2005 | Donoso et al. .............. 700/254 |
| 2005/0113976 A1* | 5/2005 | van der Meulen ........... 700/245 |
| 2007/0052646 A1 | 3/2007 | Ishiguchi |
| 2007/0112465 A1* | 5/2007 | Sadighi et al. .............. 700/254 |
| 2007/0142962 A1* | 6/2007 | Takizawa et al. ............ 700/218 |
| 2007/0269986 A1* | 11/2007 | Kalenian et al. ............. 438/692 |
| 2007/0290150 A1* | 12/2007 | Krupyshev et al. ...... 250/559.33 |
| 2008/0231866 A1* | 9/2008 | Fogel .......................... 356/614 |
| 2008/0255798 A1* | 10/2008 | Buzan ......................... 702/150 |
| 2008/0260499 A1* | 10/2008 | van der Meulen ........... 414/217 |
| 2009/0053016 A1* | 2/2009 | van der Meulen ........... 414/217 |
| 2009/0076648 A1* | 3/2009 | Numakura et al. ........... 700/228 |
| 2009/0093906 A1* | 4/2009 | Takizawa et al. ............ 700/214 |
| 2009/0095886 A1* | 4/2009 | van der Meulen et al. .......................... 250/214 R |
| 2009/0259335 A1* | 10/2009 | Ikeda et al. .................. 700/228 |
| 2009/0279989 A1* | 11/2009 | Wong et al. .................. 414/217 |
| 2010/0121487 A1* | 5/2010 | Kawaguchi et al. .......... 700/228 |
| 2010/0249993 A1* | 9/2010 | Mitsuyoshi .................. 700/228 |

* cited by examiner

SEMICONDUCTOR-PROCESSING APPARATUS EQUIPPED WITH ROBOT DIAGNOSTIC MODULE

BACKGROUND

1. Field of the Invention

The present invention relates to a semiconductor manufacturing apparatus, as well as a diagnostic module for semiconductor wafer transfer equipment that constitutes a semiconductor manufacturing apparatus.

2. Description of the Related Art

Wafer displacement that occurs on the semiconductor wafer transfer equipment of the semiconductor manufacturing apparatus has become a major problem in the production of semiconductor wafers in recent years. To be specific, when a semiconductor wafer is placed at a position displaced from the specified position in the semiconductor wafer processing chamber, process problems such as non-uniform film occur. Other problems may also occur, such as a semiconductor wafer dropping inside the semiconductor wafer storage chamber, or hitting the chamber and consequently getting damaged, in the process of returning the semiconductor wafer to the semiconductor wafer storage chamber.

One cause of this wafer displacement is change in the shape of the semiconductor wafer transfer equipment. For example, some processes implemented in semiconductor wafer processing chambers apply heat to semiconductor wafers. In this case, the tip parts of the semiconductor wafer transfer equipment that hold a semiconductor wafer (this tip part is sometimes called an "end effector") undergo heat expansion as they transfer heated semiconductor wafers. The coefficient of expansion varies depending on the material used to make the tip part of the semiconductor wafer transfer equipment. In the case of aluminum, for example, which is used for tip parts of semiconductor wafer transfer equipment, if the temperature of the semiconductor wafer is 400° C. and the temperature of the tip part is approx. 200° C., the tip part expands by approx. 1.5 mm.

Here, occurrence of heat expansion in the semiconductor wafer transfer equipment means that the tip part extends in the direction of transferring semiconductor wafers. As a result, the semiconductor wafer clamping mechanism described later on, which is attached to the semiconductor wafer transfer equipment, pushes the semiconductor wafer outward and consequently the semiconductor wafer becomes displaced toward the outer periphery from the specified position. FIGS. 2, 3 and 4 illustrate examples of a semiconductor wafer transfer equipment with a semiconductor wafer clamping mechanism. FIG. 3 shows an example of a semiconductor wafer clamping mechanism in a semiconductor wafer transfer equipment. FIG. 4 shows an example of a condition where a semiconductor wafer W is placed on a semiconductor wafer transfer equipment. This semiconductor wafer transfer equipment has an end effector 22 on a transfer arm 26 which in turn is installed rotatably on a base 27, and a wafer damper 21 is provided on a proximal end of the end effector 22. The damper 21 has arms on both sides of the end effector and a pad 25 which is used to push the substrate is provided on a distal end of each arm. The wafer W placed on the end effector 22 is pushed by the damper 21 in the direction toward the distal end of the end effector (=in the direction of the arrow), and the end is secured by pads 23 provided on the distal end of the end effector 22 (for your information, the proximal end of the wafer is secured by pads 24 provided on the proximal end of the end effector 22). As shown in FIG. 4, the semiconductor wafer is secured at the pads 23 at the tips (locations indicated by circles) by means of the clamping mechanism. If the end effector itself extends, however, the distance to each pad 23 becomes longer, as shown in FIG. 9, and consequently the semiconductor wafer is pushed toward the outer periphery, or in the direction of the arrow, and becomes displaced. Take note that FIG. 9 is exaggerated for the purpose of illustration.

Another cause of wafer displacement is wear and tear of mechanisms inside the semiconductor wafer transfer equipment. As a considerable number of semiconductor wafers are transferred, the motor and other mechanical parts change over time and consequently the stopping position of the end effector of the semiconductor wafer transfer equipment displaces from the specified position.

SUMMARY

To solve one or more of the aforementioned problems, a semiconductor wafer manufacturing apparatus according to an embodiment of the present invention is characterized in that it can have a diagnostic module for semiconductor wafer transfer equipment on one side of the semiconductor wafer transfer chamber in which no semiconductor wafer processing chamber is installed for the purpose of maintenance, for example, while one or more sensors are installed inside or outside of this module, so that when the semiconductor wafer transfer equipment is inserted into this module the position or shape of each end effector of the semiconductor wafer transfer equipment is detected and compared against the pre-registered normal condition, thereby diagnosing the integrity of the end effector of the semiconductor wafer transfer equipment.

As for the sensors installed inside or outside the module, they may be linear sensors if installed inside the module, or planar sensors (CCD) if installed outside the module. If linear sensors are used, the light emission unit and light receiving unit of a sensor may be installed vertically to detect changes in the end effector of the semiconductor wafer transfer equipment, and the light emission unit and light receiving unit of a sensor may additionally be installed in the horizontal direction to detect changes in the end effector of the semiconductor wafer transfer equipment in the height direction.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

Figure 1:
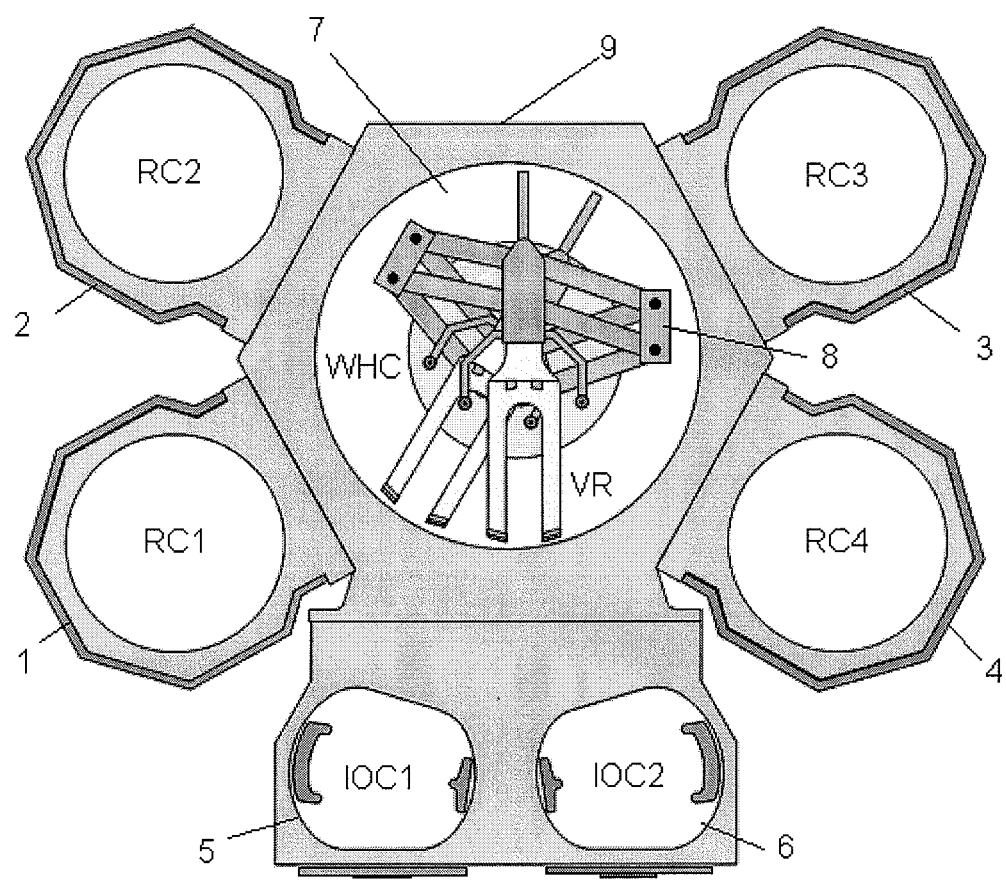
FIG. 1 is a schematic drawing showing an example of a conventional semiconductor manufacturing apparatus having four semiconductor wafer processing chambers, two semiconductor wafer I/O chambers, and one semiconductor wafer transfer chamber that houses a semiconductor wafer transfer equipment having two arms.

The present invention will be explained with reference to embodiments which are not intended to limit the present invention.

An embodiment of the present invention provides a semiconductor-processing apparatus comprising: (i) a wafer transfer chamber provided with a wafer transfer robot therein, said wafer transfer robot having an end effector for carrying a wafer; (ii) at least one reactor connected to the wafer transfer chamber, and accessible to the wafer transfer robot; and (iii) a robot diagnostic module connected to the wafer transfer chamber and accessible to the wafer transfer robot, for diagnosing the transfer robot, said robot diagnostic module comprising at least one sensor for detecting a position of the end effector when the end effector is located inside the robot diagnostic module.

In an embodiment, the apparatus may further comprise a controller operating the reactor, the wafer transfer robot, and the robot diagnostic module, storing data on a reference position of the end effector, and comparing the detected position with the reference position, thereby detecting a deviation of the end effector, if any.

In any of the foregoing embodiments, the sensor may be disposed in the robot diagnostic module at a position to detect a distal end of the end effector.

In any of the foregoing embodiments, the sensor may be a photosensor comprised of a light emission unit for emitting light and a light receiving unit for receiving light from the light emission unit. The end effector is inserted between the light emission unit and the light receiving unit and blocks the light from the light emission unit, thereby changing an illuminance received by the light receiving unit. The data on the reference position stored in the controller is a reference illuminance, and the controller compares the illuminance received by the light receiving unit with the reference illuminance, thereby detecting a deviation of the end effector, if any.

In any of the foregoing embodiments, the sensor may be a planar photosensor capable of detecting a shape of a distal end of the end effector. The data on the reference position stored in the controller may be a reference shape of the distal end of the end effector, and the controller may compare the detected shape of the distal end of the end effector with the reference shape, thereby detecting a deviation of the end effector, if any.

In any of the foregoing embodiments, the at least one sensor may comprise at least a first sensor and a second sensor. The first sensor is disposed at a position to detect a vertical position of a distal end of the end effector. The second sensor is disposed at a position to detect a horizontal position of the distal end of the end effector. The data on the reference position stored in the controller include a reference illuminance for the first sensor and a reference illuminance for the second sensor. The controller compares an illuminance detected by the first sensor when the end effector is located inside the robot diagnostic module with the reference illuminance for the first sensor. The controller also compares an illuminance detected by the second sensor when the end effector is located inside the robot diagnostic module with the reference illuminance for the second sensor. The comparisons lead to detecting a deviation of the end effector.

In any of the foregoing embodiments, the wafer transfer chamber may have a polygonal shape wherein the reactor is attached to one side of the polygonal shape, and the robot diagnostic module is attached to an other side of the polygonal shape. The other side is used for maintenance of the apparatus.

In any of the foregoing embodiments, the robot diagnostic module may be detachable from the other side when the apparatus is subjected to maintenance.

In any of the foregoing embodiments, the controller may insert the end effector of the wafer transfer robot inside the robot diagnostic module and detect a deviation of the end effector of the wafer transfer robot while a wafer is being processed in the reactor. The wafer transfer robot would have been at a home position or a stand-by position if the controller had not inserted the end effector of the wafer transfer robot inside the robot diagnostic module.

In any of the foregoing embodiments, the controller may stop processing a wafer when a deviation of the end effector is detected in the robot diagnostic module.

In any of the foregoing embodiments, the sensor may be disposed at a position to detect a position of the end effector when the end effector is extended as if the end effector loads/unloads a wafer to/from the reactor.

In another aspect, an embodiment provides a method for detecting a deviation of an end effector of a wafer transfer robot for a semiconductor-processing apparatus that comprises (i) a wafer transfer chamber provided with the wafer transfer robot therein and (ii) at least one reactor connected to the wafer transfer chamber and accessible to the wafer transfer robot. The method includes providing a robot diagnostic module connected to the wafer transfer chamber and accessible to the wafer transfer robot, for diagnosing the transfer robot. The robot diagnostic module includes at least one sensor for detecting a position of the end effector when the end effector is located inside the robot diagnostic module. The method also includes placing the end effector of the wafer transfer robot inside the robot diagnostic module. The method also includes detecting a position of the end effector using the sensor and comparing the detected position with a pre-recorded reference position, thereby detecting a deviation of the end effector, if any.

In an embodiment, detecting the position of the end effector may comprise detecting a position of a distal end of the end effector.

In any of the foregoing embodiments, the sensor may be a photosensor comprised of a paired light emission and receiving units. The light emission unit emits light and the light receiving unit receives light from the light emission unit. The end effector is inserted between the light emission unit and the light receiving unit and blocks the light from the light emission unit, thereby changing an illuminance received by the light receiving unit. Detecting the position of the end effector may comprise detecting an illuminance received by the light receiving unit. Comparing the detected position with the pre-recorded reference position may comprise comparing the detected illuminance with a reference illuminance.

In any of the foregoing embodiment, the sensor may be a planar photosensor capable of detecting a shape of a distal end of the end effector. Detecting the position of the end effector may comprise detecting a shape of the distal end of the end effector, and comparing the detected position with the pre-recorded reference position may comprise comparing the detected shape of the distal end of the end effector with a reference shape.

In any of the foregoing embodiments, the at least one sensor may comprise at least a first sensor and a second sensor. The first sensor is disposed at a position to detect a vertical position of a distal end of the end effector. The second sensor is disposed at a position to detect a horizontal position of the distal end of the end effector. Detecting the position of the end effector may comprise detecting an illuminance by the first sensor and an illuminance by the second sensor. Comparing the detected position with the pre-recorded reference position may comprise comparing the detected illuminance by the first sensor with a reference illuminance, and comparing the detected illuminance by the second sensor with a reference illuminance.

In any of the foregoing embodiments, placing the end effector of the wafer may comprise transferring the robot end effector inside the robot diagnostic module while a wafer is being processed in the reactor. The wafer transfer robot would have been at a home position or a stand-by position if the end effector of the wafer transfer robot had not been inserted inside the robot diagnostic module.

Any of the foregoing methods may further comprise stopping processing a wafer when a deviation of the end effector is detected in the robot diagnostic module in the step of comparing the detected position with the pre-recorded reference position.

The present invention will be explained with reference to the drawings which are not intended to limit the present invention. In the present disclosure where conditions and/or structures are not specified, the skilled artisan in the art can readily provide such conditions and/or structures, in view of the present disclosure, as a matter of routine experimentation.

FIG. 1 is a schematic drawing showing an example of a conventional semiconductor manufacturing apparatus. This apparatus comprises the following separate chambers (modules):

IOC1, IOC2 (In-Out Chambers) 5, 6: Semiconductor wafer I/O chambers

WHC (Wafer Handling Chamber) 7: Semiconductor wafer transfer chamber

RC1, RC2, RC3, RC4 (Reactor Chambers) 1, 2, 3, 4: Semiconductor wafer processing chambers Also in FIG. 1, a semiconductor wafer transfer equipment (vacuum robot, or VR) 8 is installed inside the semiconductor wafer transfer chamber. This semiconductor wafer transfer equipment 8 has two arms to improve the throughput (=number of semiconductor wafers processed per unit time). This allows for such operations as, for example, transferring to the applicable semiconductor wafer processing chamber the next semiconductor wafer to be processed simultaneously as when the semiconductor wafer whose processing has completed in any of the semiconductor wafer processing chambers 1 to 4 is accessed for retrieval, so that retrieval of the processed semiconductor wafer is immediately followed by placement of the new semiconductor wafer in the processing chamber. This shortens the transfer time of semiconductor wafers and consequently improves the throughput.

Figure 2:
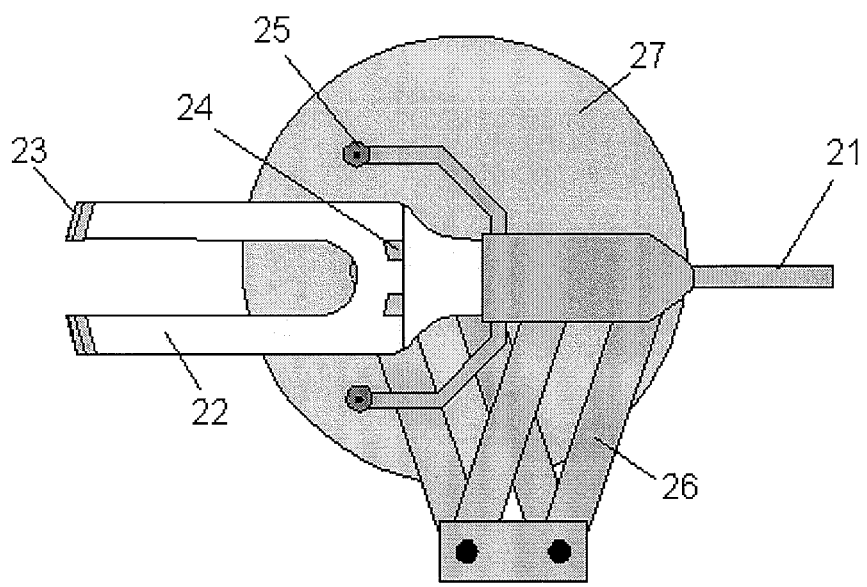
FIG. 2 is a schematic drawing showing an example of a conventional semiconductor wafer transfer equipment with a semiconductor wafer clamping mechanism.
Figure 3:
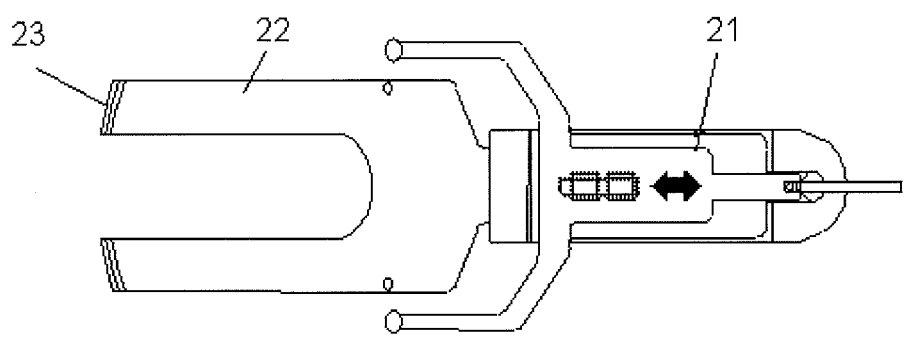
FIG. 3 is a schematic drawing showing an example of a semiconductor wafer clamping mechanism located inside a conventional semiconductor wafer transfer equipment.
Figure 4:
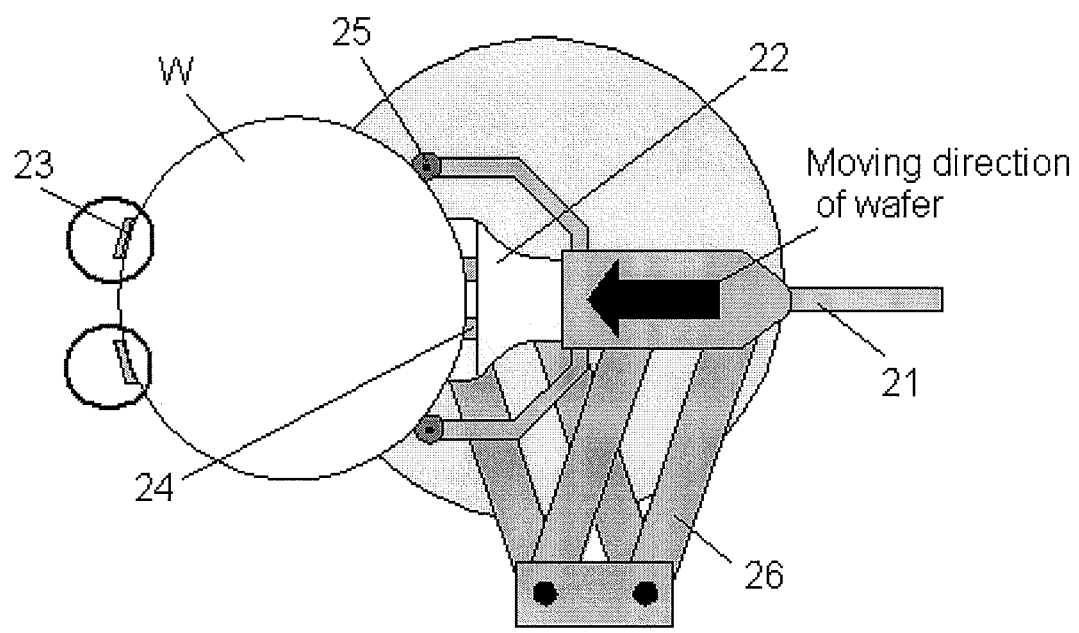
FIG. 4 is a schematic drawing showing an example of a condition where a semiconductor wafer is placed on a conventional semiconductor wafer transfer equipment.

Next, the semiconductor wafer transfer equipment 8 in FIG. 1 is shown in FIG. 2. In FIG. 2, only one arm is shown. FIG. 3 shows a mechanism drawing of a semiconductor wafer damper 21 in FIG. 2. The damper 21 operates in the directions of arrows shown in FIG. 3, and is used to hold a semiconductor wafer that has been placed. Similarly, FIG. 4 shows the semiconductor wafer transfer equipment in a condition where a semiconductor wafer is placed on it. In FIG. 4, the direction in which the semiconductor wafer W is transferred is shown by an arrow, and two pads 23 which are used to secure the semiconductor wafer are also illustrated (locations indicated by circles).

In FIG. 1, only four semiconductor wafer processing chambers are installed, and a top side 9 of the semiconductor wafer transfer chamber in the figure is not used. This is because normally such an unused side is required for the maintenance of the semiconductor wafer processing chambers and semiconductor wafer transfer equipment of the semiconductor manufacturing apparatus.

Figure 5:
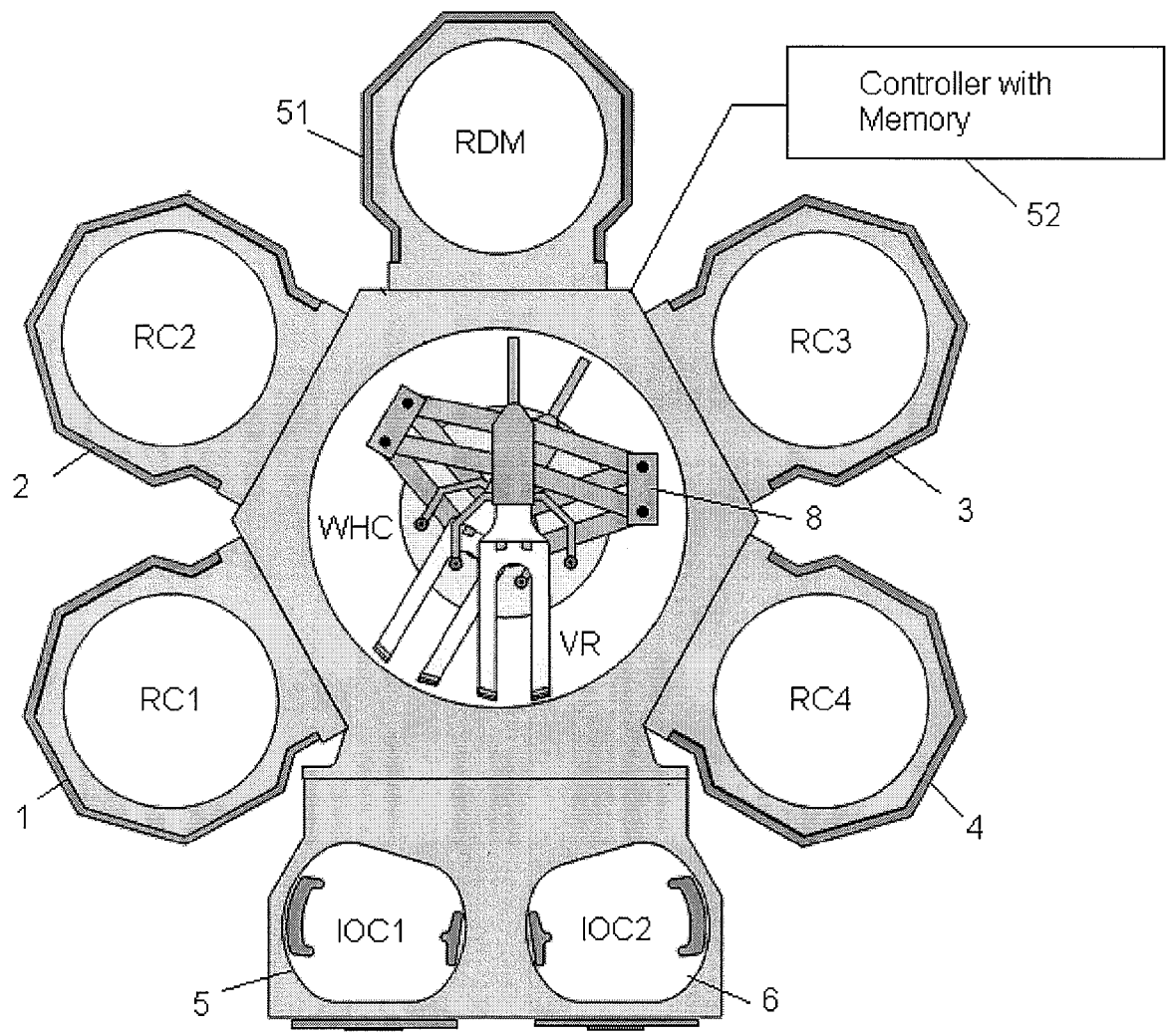
FIG. 5 is a schematic drawing showing an example of a semiconductor manufacturing apparatus in which a diagnostic module for semiconductor wafer transfer equipment is installed according to a configuration in an embodiment of the present invention.

Here, in an embodiment of the present invention a diagnostic module for semiconductor wafer transfer equipment RDM51, which is explained below, is installed on the unused side 9 of the semiconductor wafer transfer chamber, as shown in FIG. 5. This way, the same operation that inserts the semiconductor wafer transfer equipment into each semiconductor wafer processing chamber also inserts the semiconductor wafer transfer equipment into the RDM51, so that the relative position of the semiconductor wafer transfer equipment at each semiconductor wafer processing chamber can be recreated inside the RDM. Also in an embodiment, the RDM51 is removable and thus it can be removed at the time of the maintenance, thereby eliminating any maintenance problems of the module itself.

RDM (Robot Diagnostic Module) 51: Diagnostic module for semiconductor wafer transfer equipment In an embodiment of the present invention, sensors are installed on this diagnostic module for semiconductor wafer transfer equipment to detect, using the sensors, the end effector of the semiconductor wafer transfer equipment when the end effector is inserted into the module, in order to diagnose the integrity of the end effector.

Examples are explained where linear photosensors (linear sensors), each comprising a light emission unit and a light receiving unit, are installed inside the diagnostic module for semiconductor wafer transfer equipment. Take note, however, that the present invention is not at all limited to these specific uses of sensors.

Figure 6:
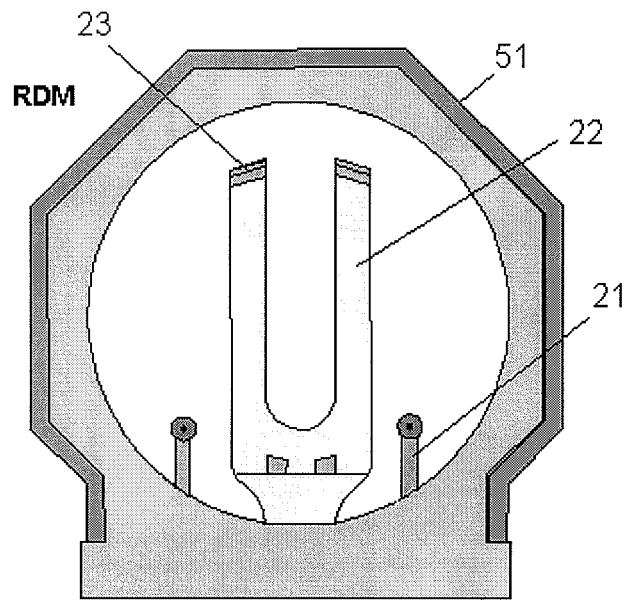
FIG. 6 is a schematic drawing showing an example of a condition of a diagnostic module for semiconductor wafer transfer equipment according to a configuration in an embodiment of the present invention, where an end effector of the semiconductor wafer transfer equipment is inserted into the module.

FIG. 6 shows a condition where the semiconductor wafer transfer equipment in FIG. 2 is inserted into the diagnostic module for semiconductor wafer transfer equipment RDM51. At this time, the semiconductor wafer transfer equipment has no wafer on it.

Figure 7:
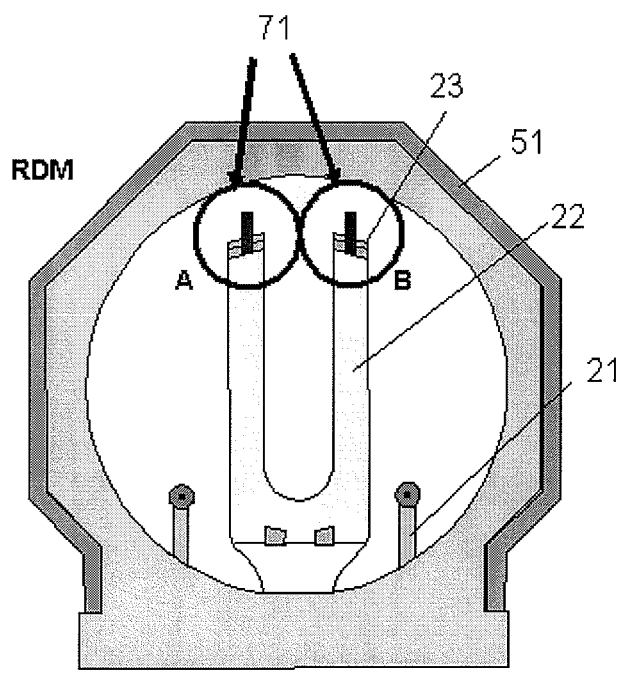
FIG. 7 is a schematic drawing showing an example of positions where photosensors should be located inside a diagnostic module for semiconductor wafer transfer equipment according to a configuration in an embodiment of the present invention.

Here, photosensors 71 are installed at the two positions of A and B (locations indicated by circles) in FIG. 7, where it is assumed that the tips (tip pads 23) of the end effector 22 of the semiconductor wafer transfer equipment are at the correct positions.

Figure 8:
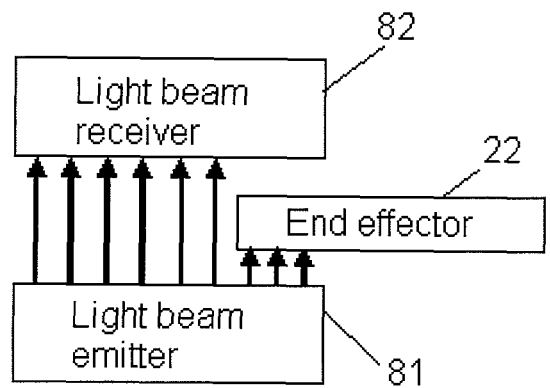
FIG. 8 is a schematic drawing showing an example of a condition where light for an photosensor (linear sensor) with a width is partially blocked.

Next, the operating principle of a photosensor is shown in FIG. 8. The photosensors used in this embodiment each comprise a pair of a light emission unit 81 and a light receiving unit 82, where both have a certain width so that the sensor output changes according to the amount of light blocked by a light blocking object (end effector 22). Preferably, the light emission unit 81 is a single light source that emits semiconductor laser light (such as laser light having a wavelength of 670 nm), while the light receiving unit 82 comprises a CCD element arranged in a line shape. Also, preferably, the photosensor has different dimensions for its width and length, and particularly the light receiving unit 52 has a longitudinal direction so as to properly detect wafer displacement (the light receiving unit 82 and light emission unit 81 are preferably designed as a pair and have roughly the same shape). For example, the light emission unit emits light through an area of 9 mm×3 mm, while the light receiving unit has an effective receiving area of 7 mm×0.085 mm (the aspect ratio of the effective receiving area is 10 to 100 times). Take note that the light emission unit 81 is positioned at the bottom, while the light receiving unit 82 is positioned at the top, in order to facilitate the position adjustment of the light receiving sensor. However, the positioning of the two is not limited to this arrangement. In an embodiment, PBZ-CL007V (laser line CCD manufactured by Yamatake) can be used favorably.

Figure 9:
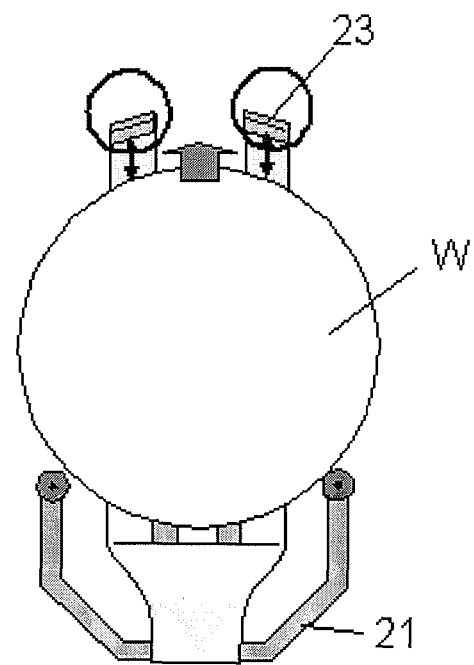
FIG. 9 is a schematic drawing showing an example of an end effector of a semiconductor wafer transfer equipment which has extended in the direction of transferring semiconductor wafers due to heat expansion.

As described above, when the end effector 22 of the semiconductor wafer transfer equipment undergoes heat expansion, the tips 23 of the end effector extend in the direction of transferring semiconductor wafers as shown in FIG. 9 (the expansion is exaggerated in the figure for the purpose of illustration). As a result, the semiconductor wafer is pushed in the extending direction of the end effector 22 by the semiconductor wafer clamping mechanism 21 of the semiconductor wafer transferring equipment, and the wafer is consequently displaced toward the outer periphery from its specified position.

Here, the two photosensors 71 installed at the positions shown in FIG. 7 can be used to detect any extension of the end effector 22 due to heat expansion. If FIG. 8 is used, this specifically means that when the end effector extends, light for the photosensor is blocked more than when the end effector 22 is at the correct position. Since the photosensor output drops as a result, it is recognized that an extension corresponding to the drop in output has occurred.

This way, the photosensors 71 in the diagnostic module for semiconductor wafer transfer equipment allow for detection of change in the shape of the end effector of the semiconductor wafer transfer equipment. Note that if the end effector of the semiconductor wafer transfer equipment drops out for some reason, which is different from the situation explained above, the resulting shape change can still be detected by a method similar to the above (in this case, the photosensor output will increase).

Figure 10:
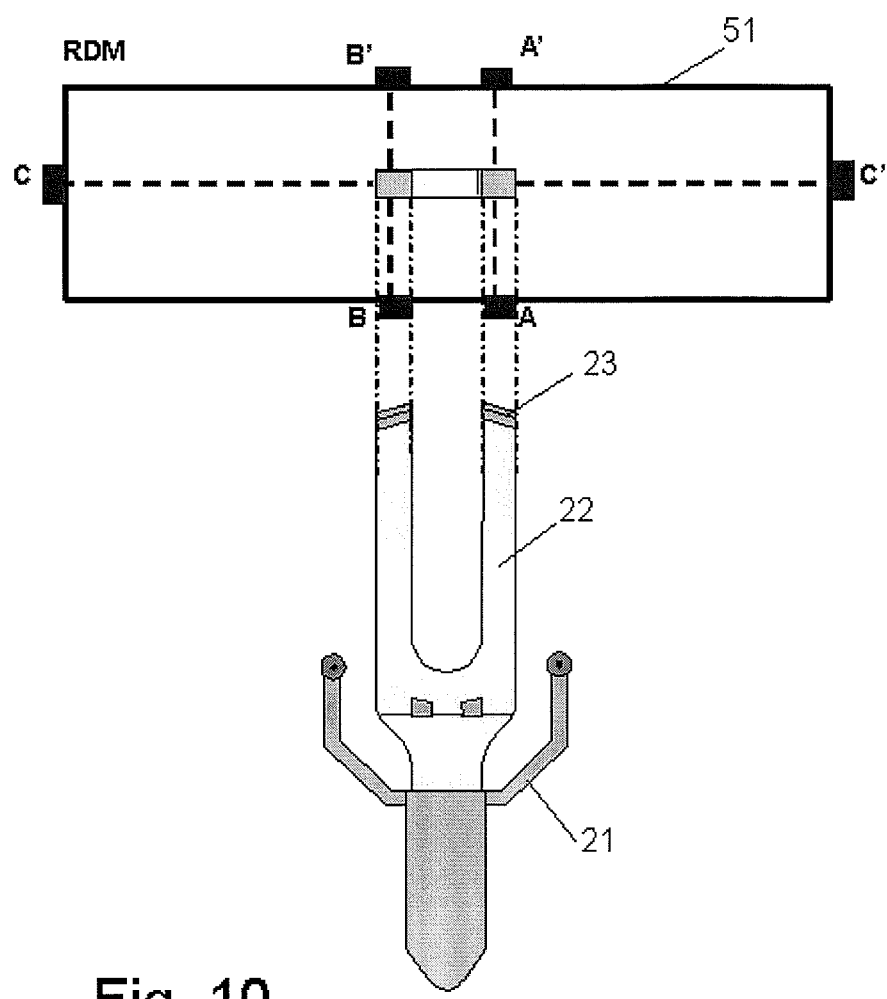
FIG. 10 provides a schematic drawing of a longitudinal section view from the moving direction, showing an example of positions where photosensors should be located inside a diagnostic module for semiconductor wafer transfer equipment according to a configuration in an embodiment of the present invention in order to detect the position in the height direction of the end effector of the semiconductor wafer transfer equipment, as well as a schematic drawing of a plan view of the end effector.

Similarly, different photosensors can be used to detect changes occurring in the positions of the end effector of the semiconductor wafer transfer equipment which are different from the detection position explained above. FIG. 10 provides a longitudinal section view of a diagnostic module for semiconductor wafer transfer equipment according to an embodiment of the present invention, as well as a schematic drawing showing a plan view of the end effector 22. The photosensors A, A', B, B' are the same as those shown in FIG. 7, and are installed on the top and bottom opposing surfaces of the RDM. Here, photosensors C, C' are added in the horizontal positions near the opposing side walls of the RDM. In this case, light for the photosensors is completely blocked when the semiconductor wafer transfer equipment is positioned at the correct height. If something happens and the stopped position of the semiconductor wafer transfer equipment becomes lower or higher, however, light for one or more photosensors is not blocked and thus the photosensor output increases. This way, the height (position in the Z direction) of the semiconductor wafer transfer equipment can be detected.

Figure 11:
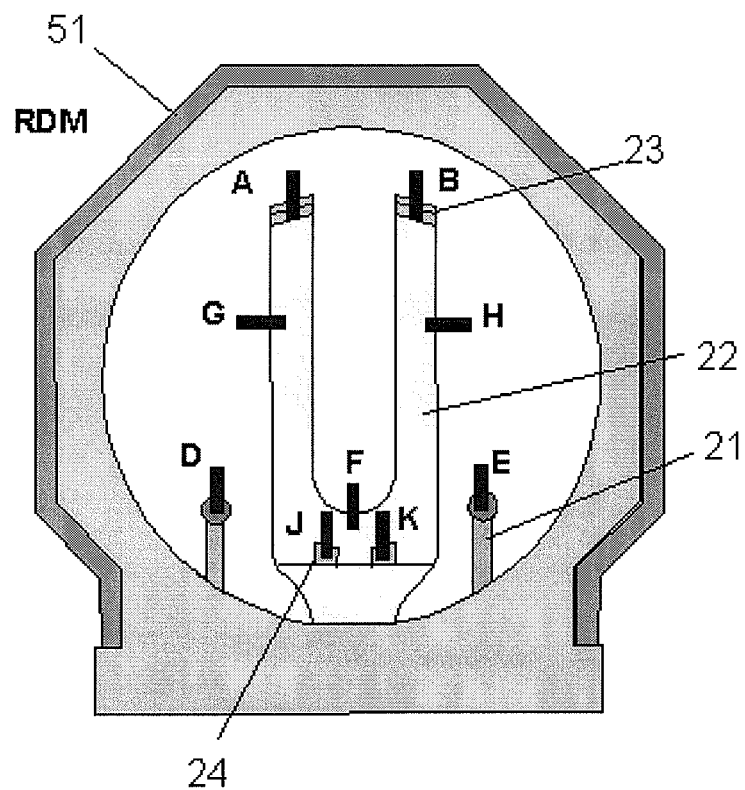
FIG. 11 is a schematic drawing showing an example of positions of photosensors if photosensors are to be added inside a diagnostic module for semiconductor wafer transfer equipment according to a configuration in an embodiment of the present invention.

The above example is applied in further detail by installing photosensors D, E, F as shown in FIG. 11. These sensors can detect changes in the semiconductor wafer clamping mechanism in the same manner as explained above, as well as shape change, or specifically heat expansion or dropout, occurring at parts near the center of the end effector of the semiconductor wafer transfer equipment.

Furthermore when photosensors are installed at the positions of G and H (both sides of the end effector) in FIG. 11, displacement of the semiconductor wafer transfer equipment in the rotating direction or lateral direction can be detected. In addition, operational accuracy of the semiconductor wafer transfer equipment can also be checked by giving a command for a rotating motion of several pulses to the semiconductor wafer transfer equipment when it is inserted to transfer a semiconductor wafer and then by inspecting if the equipment operates according to the command.

By the way, J and K in FIG. 11 indicate positions corresponding to wafer pads 24 near the center of the semiconductor wafer transfer equipment. However, these locations undergo wear and tear after a long period of use. Since these locations are normally given a mirror surface finish, reflection-type photosensors can be used to detect such wear and tear that results in lower reflection. Accordingly, reflection-type photosensors are used at the positions of J and K in FIG. 11. While FIG. 8 illustrates the operating principle of a transmission-type photosensor, FIG. 12 illustrates the operating principle of a reflection-type photosensor.

If an photosensor is further installed at the position of F (proximal inner end of the end effector) in FIG. 11, it is possible to detect a possible displacement caused by factors other than heat expansion, because this location receives little impact from heat expansion of the end effector.

Additionally, installing photosensors at the positions of D and E (tip positions of the arms of wafer dampers 21) in FIG. 11 enables detection of a displacement caused by wear and tear, heat expansion or other factors. If the wafer damper 21 deforms or other similar problem occurs, the wafer can no longer be pushed to an appropriate position. Accordingly, it is effective to check for deformation in this location.

Figure 12:
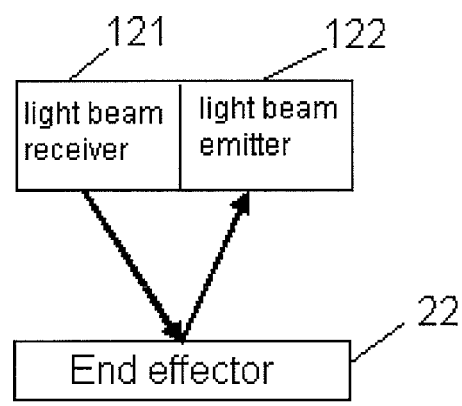
FIG. 12 a schematic drawing showing the operating principle of a reflection-type photosensor.

In FIG. 12, a light emission unit 121 and light receiving unit 122 are both positioned above the end effector 22. Light emitted by the light emission unit 122 reflects on the surface of the end effector 22, and is received by the light receiving unit 122, to permit evaluation of the condition of wear according to the intensity of reflected light. The light emission unit 121 and light receiving unit 122 used here can be the same as the light emission unit 81 and light receiving unit 82 shown in FIG. 8.

Figure 13:
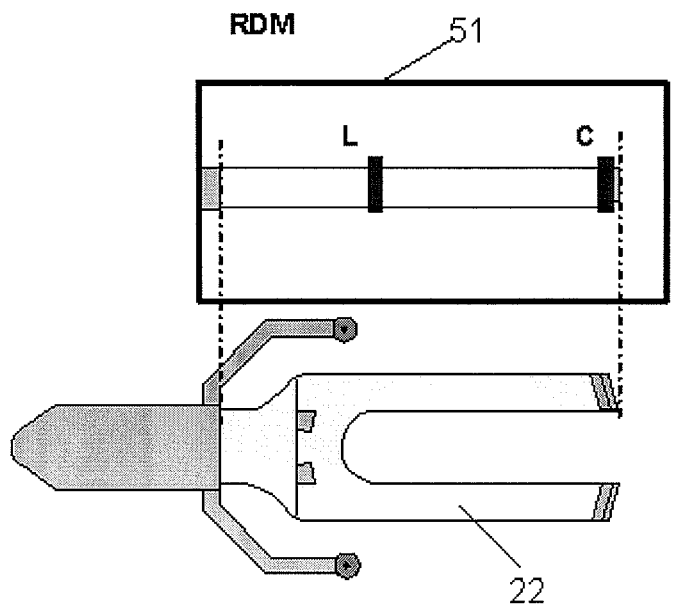
FIG. 13 provides a schematic drawing of a side view from the moving direction, showing an example of positions of photosensors when photosensors are to be added inside a diagnostic module for semiconductor wafer transfer equipment according to a configuration in an embodiment of the present invention in order to detect the position in the height direction of the end effector of the semiconductor wafer transfer equipment, as well as a schematic drawing of a plan view of the end effector.
Figure 14:
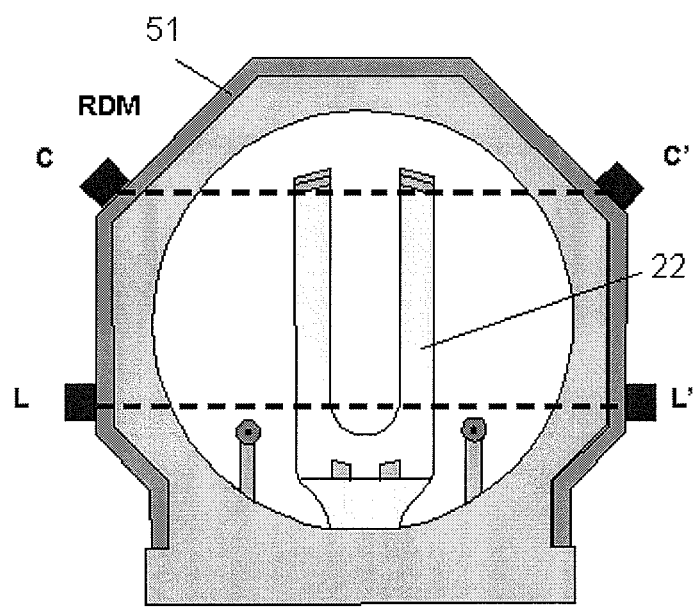
FIG. 14 a schematic drawing of a top view of the diagnostic module for semiconductor wafer transfer equipment and photosensors shown in FIG. 13.

Next, photosensors can also be added in a similar manner for detection in the height direction of the semiconductor wafer transfer equipment. FIG. 13 is a schematic drawing showing a side view of a diagnostic module for semiconductor wafer transfer equipment. The photosensor C shown in FIG. 10 is positioned at the tip 23 of the semiconductor wafer transfer equipment in FIG. 13. Here, installing an photosensor at the position of L in FIG. 13 allows for detection of the condition of warping and deflection of the end effector 22 of the semiconductor wafer transfer equipment. FIG. 14 gives a top view of FIG. 13, showing the position relationships of photosensors C, C', L, L'.

Figure 15:
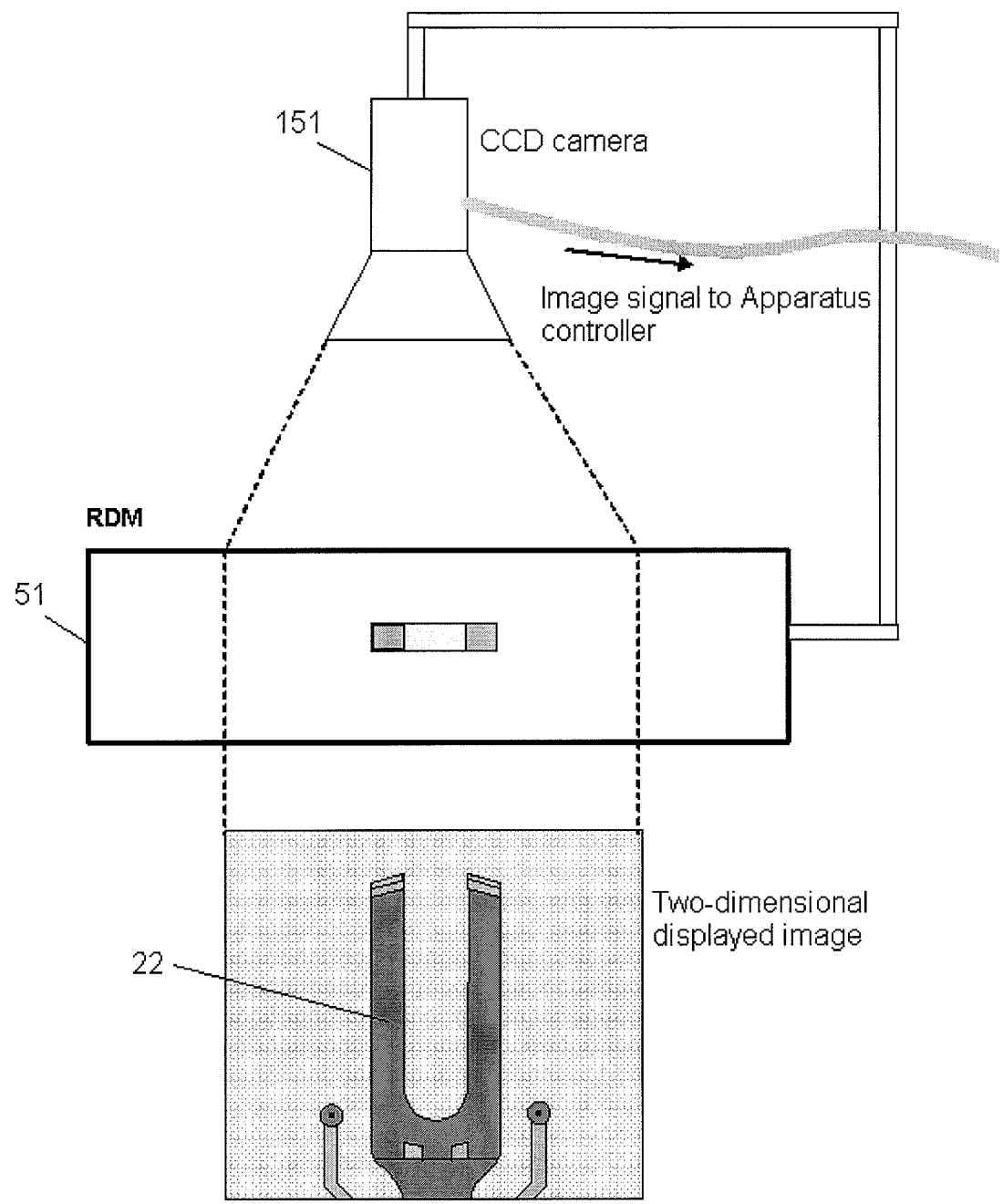
FIG. 15 is a schematic drawing of a section view from the moving direction, showing an example of installing a planar sensor (CCD) outside a diagnostic module for semiconductor wafer transfer equipment according to a configuration in an embodiment of the present invention, as well as a schematic drawing of a plan view of the end effector.

As an example of installing a sensor outside the diagnostic module for semiconductor wafer transfer equipment, the example shown in FIG. 15 has a planar sensor (CCD) 151 installed above the module 51. In this case, a two-dimensional image storage area is allocated to store and register an image of the end effector 22 of the semiconductor wafer transfer equipment at the correct position, which means that any change in the shape of the end effector of the semiconductor wafer transfer equipment can be detected by comparing the two-dimensional image taken when the semiconductor wafer transfer equipment is inserted into the diagnostic module, against the pre-registered two-dimensional image.

Take note that, as for the timing at which to insert the semiconductor wafer transfer equipment into the diagnostic module, in a normal lot processing of semiconductor wafers some type of semiconductor process is performed in the semiconductor wafer processing chamber after the semiconductor wafer transfer equipment has transferred a semiconductor wafer into the semiconductor wafer processing chamber or transferred a semiconductor wafer out of the semiconductor wafer processing chamber, and accordingly the semiconductor wafer transfer equipment remains on standby during this process. Normally, therefore, the semiconductor wafer transfer equipment can be diagnosed without affecting the throughput of the semiconductor manufacturing apparatus, by inserting the semiconductor wafer transfer equipment into the module for diagnosis at these timings where the semiconductor wafer transfer equipment is on standby.

Figure 16:
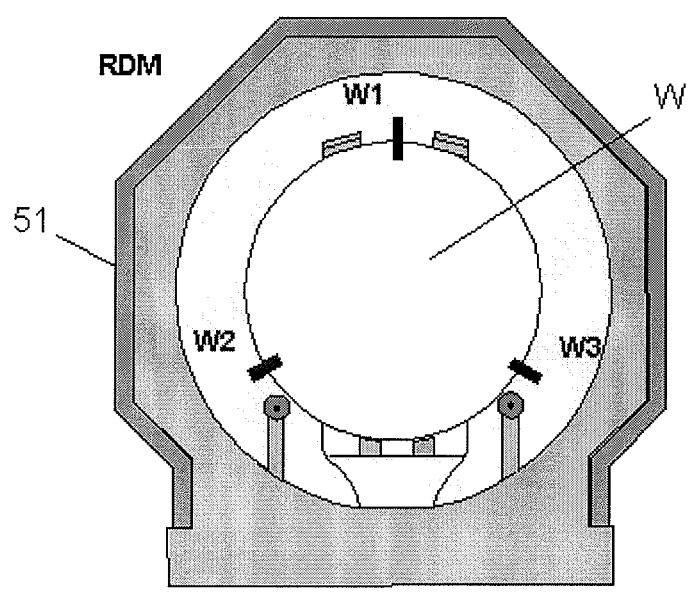
FIG. 16 is a schematic drawing showing an example of positions where photosensors should be installed inside a diagnostic module for semiconductor wafer transfer equipment according to a configuration in an embodiment of the present invention, in a condition where the semiconductor wafer transfer equipment on which a semiconductor is placed is inserted into the module.

Or, the semiconductor wafer transfer equipment may stand by with a semiconductor wafer placed on it. In this case, three points (W1, W2 and W3) on the outer periphery of the semiconductor wafer W at the correct position are detected by photosensors, as shown in FIG. 16. By installing photosensors this way, any displacement of the semiconductor wafer placed on the semiconductor wafer transfer equipment can also be detected.

If any abnormality is found as a result of the aforementioned diagnosis of the position of the semiconductor wafer transfer equipment or semiconductor wafer, the apparatus controller stops the semiconductor wafer processing of the apparatus to prevent defective semiconductor wafers from being manufactured. In this case, a signal can be sent to a controller 52 that controls the entire apparatus shown in FIG. 5 in order to implement a desired control through this controller. This controller can have a memory function to store information regarding the correct position of the end effector beforehand. Take note that such control system can be implemented with ease by those skilled in the art based on the contents described herein.

Also note that this diagnostic module for semiconductor wafer transfer equipment preferably has a structure that can be easily removed at the time of maintenance. This way, diagnosis of the semiconductor wafer transfer equipment can be performed without affecting the maintainability.

It should be noted that the diagnostic module for semiconductor wafer transfer equipment does not perform any processing of semiconductor wafers, and thus it can have any sensors installed inside. For example, it is possible to install temperature sensors to measure the temperature of the semiconductor wafer transfer equipment and numerous other applications can also be considered, any of which can be easily implemented by those skilled in the art based on the contents described herein.

As explained above, a semiconductor manufacturing apparatus provided with a diagnostic module for semiconductor wafer transfer equipment according to at least one embodiment of the present invention allows for diagnosis of the end effector of the semiconductor wafer transfer equipment without lowering the lot processing throughput of semiconductor wafers. In an embodiment, the module has a structure that can be easily removed at the time of maintenance, which enables diagnosis without lowering the maintainability.

The present invention includes the above mentioned embodiments and other various embodiments including the following:

1) A semiconductor manufacturing apparatus, comprising: a semiconductor wafer transfer chamber, a semiconductor wafer processing chamber, a semiconductor wafer transfer equipment, and a diagnostic module for semiconductor wafer transfer equipment; said semiconductor manufacturing apparatus characterized in that the diagnostic module for semiconductor wafer transfer equipment has at least one sensor at a specified position and when the semiconductor wafer transfer equipment inserts an end effector into the diagnostic module for semiconductor wafer transfer equipment, the sensor detects the end effector of the semiconductor wafer transfer equipment, after which the detected information is compared against a record of a normal condition of the end effector of the semiconductor wafer transfer equipment, in order to detect a change in the end effector of the semiconductor wafer transfer equipment.

2) A semiconductor manufacturing apparatus according to 1) above, characterized in that the sensor represents a pair of photosensors comprising a light emission unit and a light receiving unit so that when the end effector of the semiconductor wafer transfer equipment blocks light for the photosensor, the amount of blocked light for the photosensor is compared against a pre-registered amount of light blocked at the correct position of the end effector of the semiconductor wafer transfer equipment, in order to detect a change in the end effector of the semiconductor wafer transfer equipment.

3) A semiconductor manufacturing apparatus according to 1) above, characterized in that the sensor is a planar photosensor, where the shape of the end effector of the semiconductor wafer transfer equipment is recognized and compared against a pre-registered correct shape of the end effector of the semiconductor wafer transfer equipment, in order to detect a change in the end effector of the semiconductor wafer transfer equipment.

4) A semiconductor manufacturing apparatus according to 2) above, characterized in that there are at least two units of the photosensor, where a photosensor 1 is arranged in the top/bottom vertical direction of the end effector of the semiconductor wafer transfer equipment, while a photosensor 2 is arranged in the left/right horizontal direction of the end effector of the semiconductor wafer transfer equipment, to compare the amount of blocked light for each photosensor against a pre-registered amount of light blocked at the correct position of the end effector of the semiconductor wafer transfer equipment, in order to detect a change in the end effector of the semiconductor wafer transfer equipment.

5) A semiconductor manufacturing apparatus according to 1) above, characterized in that the diagnostic module for semiconductor wafer transfer equipment is installed on one side of the semiconductor wafer transfer chamber where no semiconductor wafer processing chamber is originally installed for the purpose of maintenance.

6) A semiconductor manufacturing apparatus according to 5) above, characterized in that the diagnostic module for semiconductor wafer transfer equipment can be removed and reinstalled at the time of maintenance.

7) A semiconductor manufacturing apparatus according to 1) above, characterized in that while a semiconductor wafer is being processed in the semiconductor wafer processing chamber and therefore the semiconductor wafer transfer equipment is not operating, the semiconductor wafer transfer equipment inserts the end effector into the diagnostic module for semiconductor wafer transfer equipment, in order to detect a change in the end effector of the semiconductor wafer transfer equipment.

8) A semiconductor manufacturing apparatus according to 1) above, characterized in that the manufacturing process of semiconductor wafers is stopped upon detection of any change in the end effector of the semiconductor wafer transfer equipment in the diagnostic module for semiconductor wafer transfer equipment.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A semiconductor-processing apparatus comprising:
   a wafer transfer chamber provided with a wafer transfer robot therein, said wafer transfer robot having an end effector for carrying a wafer, said wafer transfer chamber having multiple sides for attaching chambers thereto;
   at least one reactor attached to one side of the wafer transfer chamber, and accessible to the wafer transfer robot; and
   a robot diagnostic module being a chamber shaped like the at least one reactor which is attached to another side of the wafer transfer chamber and accessible to the wafer transfer robot to diagnose the transfer robot inside the robot diagnostic module while a wafer is being processed in the at least one reactor and the end effector of the transfer robot is empty-handed or carrying a wafer, said robot diagnostic module being incapable of performing any processing of semiconductor wafers and comprising at least one sensor attached thereto for detecting a position of the end effector when the end effector is located inside the robot diagnostic module, wherein a relative position of the transfer robot at each reactor can be recreated inside the robot diagnostic module.

2. The semiconductor-processing apparatus according to claim 1, further comprising a controller operating the reactor, the wafer transfer robot, and the robot diagnostic module, storing data on a reference position of the end effector, and comparing the detected position with the reference position, thereby detecting a deviation of the end effector, if any.

3. The semiconductor-processing apparatus according to claim 1, wherein the sensor is disposed in the robot diagnostic module at a position to detect a distal end of the end effector.

4. The semiconductor-processing apparatus according to claim 1, wherein the sensor is a photosensor comprised of a light emission unit for emitting light and a light receiving unit for receiving light from the light emission unit, wherein the end effector is inserted between the light emission unit and the light receiving unit and blocks the light from the light emission unit, thereby changing an illuminance received by the light receiving unit, wherein the data on the reference position stored in the controller is a reference illuminance, and the controller compares the illuminance received by the light receiving unit with the reference illuminance, thereby detecting a deviation of the end effector, if any.

5. The semiconductor-processing apparatus according to claim 1, wherein the sensor is a planar photosensor capable of detecting a shape of a distal end of the end effector, the data on the reference position stored in the controller is a reference shape of the distal end of the end effector, and the controller compares the detected shape of the distal end of the end effector with the reference shape, thereby detecting a deviation of the end effector, if any.

6. The semiconductor-processing apparatus according to claim 1, wherein the at least one sensor comprises at least a first sensor and a second sensor, said first sensor being disposed at a position to detect a vertical position of a distal end of the end effector, said second sensor being disposed at a position to detect a horizontal position of the distal end of the end effector, wherein the data on the reference position stored in the controller include a reference illuminance for the first sensor and a reference illuminance for the second sensor, and the controller compares an illuminance detected by the first sensor when the end effector is located inside the robot diagnostic module with the reference illuminance for the first sensor, and the controller compares an illuminance detected by the second sensor when the end effector is located inside the robot diagnostic module with the reference illuminance for the second sensor, thereby detecting a deviation of the end effector.

7. The semiconductor-processing apparatus according to claim 1, wherein said other side of the wafer transfer chamber is used for maintenance of the apparatus.

8. The semiconductor-processing apparatus according to claim 7, wherein the robot diagnostic module is detachable from the other side when the apparatus is subjected to maintenance.

9. The semiconductor-processing apparatus according to claim 2, wherein the controller inserts the end effector of the wafer transfer robot inside the robot diagnostic module and detects a deviation of the end effector of the wafer transfer robot while a wafer is being processed in the reactor.

10. The semiconductor-processing apparatus according to claim 1, wherein the controller stops processing a wafer when a deviation of the end effector is detected in the robot diagnostic module.

11. The semiconductor-processing apparatus according to claim 1, wherein the sensor is disposed at a position to detect a position of the end effector when the end effector is extended as if the end effector loads/unloads a wafer to/from the reactor.

12. A method for inhibiting defective wafers from being manufactured by detecting a deviation of an end effector of a wafer transfer robot for a semiconductor-processing apparatus that comprises: (i) a wafer transfer chamber provided with the wafer transfer robot therein, said wafer transfer chamber having multiple sides for attaching chambers thereto, (ii) at least one reactor attached to one side of the wafer transfer chamber and accessible to the wafer transfer robot, and (iii) a robot diagnostic module being a chamber shaped like the at least one reactor attached to another side of the wafer transfer chamber and accessible to the wafer transfer robot for diagnosing the transfer robot, said robot diagnostic module said robot diagnostic module being incapable of performing any processing of semiconductor wafers and comprising at least one sensor attached thereto for detecting a position of the end effector when the end effector is located inside the robot diagnostic module, wherein a relative position of the transfer robot at each reactor can be recreated inside the robot diagnostic module, said method comprising, while a wafer is being processed in the at least one reactor and the end effector of the wafer transfer robot is empty-handed or carrying a wafer:

placing the end effector of the wafer transfer robot inside the robot diagnostic module;

detecting a position of the end effector using the sensor;

comparing the detected position with a pre-recorded reference position, thereby detecting a deviation of the end effector; and stopping processing a wafer when a deviation of the end effector is detected in the robot diagnostic module when comparing the detected position with the pre-recorded reference position.

13. The method according to claim 12, wherein detecting the position of the end effector comprises detecting a position of a distal end of the end effector.

14. The method according to claim 12, wherein the sensor is a photosensor comprised of a light emission unit for emitting light and a light receiving unit for receiving light from the light emission unit, wherein the end effector is inserted between the light emission unit and the light receiving unit and blocks the light from the light emission unit, thereby changing an illuminance received by the light receiving unit, wherein detecting the position of the end effector comprises detecting an illuminance received by the light receiving unit, and comparing the detected position with the pre-recorded reference position comprises comparing the detected illuminance with a reference illuminance.

15. The method according to claim 12, wherein the sensor is a planar photosensor capable of detecting a shape of a distal end of the end effector, wherein detecting the position of the end effector comprises detecting a shape of the distal end of the end effector, and comparing the detected position with the pre-recorded reference position comprises comparing the detected shape of the distal end of the end effector with a reference shape.

16. The method according to claim 12, wherein the at least one sensor comprises at least a first sensor and a second sensor, said first sensor being disposed at a position to detect a vertical position of a distal end of the end effector, said second sensor being disposed at a position to detect a horizontal position of the distal end of the end effector, wherein detecting the position of the end effector comprises detecting an illuminance by the first sensor and an illuminance by the second sensor, and comparing the detected position with the pre-recorded reference position comprises comparing the detected illuminance by the first sensor with a reference illuminance and comparing the detected illuminance by the second sensor with a reference illuminance.

17. The method according to claim 12, wherein placing the end effector of the wafer comprises transferring the wafer transfer robot inside the robot diagnostic module while a wafer is being processed in the reactor.

18. The method according to claim 12, wherein the steps for detecting the deviation of the end effector are conducted when the wafer transfer robot is to be on standby so as to detect the deviation of the end effector without affecting the throughput of wafers by the semiconductor-processing apparatus.

* * * * *